(12) United States Patent
Kesil

(10) Patent No.: US 10,418,263 B2
(45) Date of Patent: Sep. 17, 2019

(54) OVERHEAD TRANSPORTATION SYSTEM FOR TRANSPORTING OBJECTS BETWEEN MULTIPLE WORK STATIONS

(71) Applicant: Boris Kesil, Santa Clara, CA (US)

(72) Inventor: Boris Kesil, Santa Clara, CA (US)

( * ) Notice: Subject to any disclaimer, the term of this patent is extended or adjusted under 35 U.S.C. 154(b) by 72 days.

(21) Appl. No.: 15/876,130

(22) Filed: Jan. 20, 2018

(65) Prior Publication Data

US 2019/0229003 A1    Jul. 25, 2019

(51) Int. Cl.
*H01L 21/677* (2006.01)
*B65G 1/04* (2006.01)

(52) U.S. Cl.
CPC ...... *H01L 21/67733* (2013.01); *B65G 1/0457* (2013.01); *B65G 1/0464* (2013.01); *H01L 21/67706* (2013.01); *H01L 21/67712* (2013.01)

(58) Field of Classification Search
CPC .................. B65G 1/0457; H01L 21/67733
See application file for complete search history.

(56) References Cited

U.S. PATENT DOCUMENTS

| | | |
|---|---|---|
| 6,183,184 B1 | 2/2001 | Shiwaku |
| 7,099,009 B2 | 8/2006 | DeGeorge et al. |
| 7,165,927 B2 | 1/2007 | Doherty et al. |
| 7,441,999 B2 | 10/2008 | Nakao et al. |
| 7,771,153 B2 | 8/2010 | Doherty et al. |
| 8,197,172 B2 | 6/2012 | Doherty et al. |
| 8,967,403 B2 * | 3/2015 | Won ........................ B66C 19/00 212/319 |
| 8,977,387 B2 | 3/2015 | Wang et al. |
| 9,004,840 B2 * | 4/2015 | Kinugawa ......... H01L 21/67733 414/281 |
| 9,881,824 B2 * | 1/2018 | Ito ........................ H01L 21/6773 |
| 2006/0072987 A1 * | 4/2006 | Hoshino .............. B65G 1/0457 414/277 |
| 2006/0222479 A1 * | 10/2006 | Shiwaku .............. B65G 1/0457 414/267 |
| 2008/0168920 A1 * | 7/2008 | Nakashima .......... B65G 1/0457 104/124 |
| 2013/0202392 A1 * | 8/2013 | Morimoto ......... H01L 21/67733 414/267 |
| 2017/0197795 A1 * | 7/2017 | Murao .................... B65G 43/00 |
| 2018/0122656 A1 * | 5/2018 | Murakami .............. B66C 13/23 |

* cited by examiner

*Primary Examiner* — Jonathan Snelting

(57) ABSTRACT

Proposed is an overhead transportation system for transporting FOUPs in the environment of semiconductor production. The system includes a pair of rails and a hoist travelling along the rails on two pairs of independently controlled wheels. The wheels are driven from in-wheel drive motors and are provided with lateral guide rollers that prevent the wheels from contact with the side walls of the rails. The FOUP gripper mechanism for grasping FOUPs is suspended from the hoist on multifunctional electrically conductive straps, which raise a gripper-grasped FOUP by pulling it up together with the lower pulleys of the strap-guiding unit. The gripper mechanism is attached to a swinging member rotationally installed on a slider, which is laterally moveable from the hoist toward a work station. The in-wheel motors receive power from batteries on the hoist. Other drives are fed from an external source switched in to the hoist on work stations.

20 Claims, 10 Drawing Sheets

OVERHEAD TRANSPORTATION SYSTEM FOR TRANSPORTING OBJECTS BETWEEN MULTIPLE WORK STATIONS

FIELD OF THE INVENTION

The present invention relates generally to Overhead Transportation systems, and, in particular, to such systems for transportation of Front Opening Unified Pods or Front Opening Universal Pods (FOUPs) which are special enclosures for holding silicon wafers in a controlled environment during processing of semiconductor wafers in a wafer-processing shop of the semiconductor manufacturing industry.

RELATED ART

Overhead product transportation systems, suspended from the ceiling of a shop, are known in the art and find wide use in various manufacturing industries, including semiconductor production.

For example, U.S. Pat. No. 6,183,184 Issued on Feb. 6, 2001 to T. Shiwaku discloses a work transport system having an overhead travelling hoist that runs along a rail arranged near the ceiling, arranged with a storage rack member upon which work may be loaded, between the floor and the rail. As the storage rack upon which work may be loaded is arranged between the floor and the rail, the space of the processing station and floor may be decreased, and the transfer time of the work by the overhead travelling hoist may be reduced.

U.S. Pat. No. 7,165,927 issued on Jan. 23, 2007 to Brian J. Doherty, et al. relates to an automated material handling system for semiconductor manufacturing based on a combination of vertical carousels and overhead hoist. The system allows an overhead hoist transport vehicle to load/unload parts directly to/from storage units included in the system. The system includes an overhead hoist transport subsystem and a vertical carousel stocker having a plurality of storage bins. The subsystem includes an overhead hoist transport vehicle traveling along a suspended track defining a predetermined route. The route passes over the stocker, which allows the vehicle to access parts directly from one of the storage bins. The selected bin is positioned at the top of the stocker underneath the track. Next, the vehicle is moved along the track to a position above the selected bin. The hoist is then lowered parallel to the longitudinal axis of the stocker toward the selected bin. Finally, the hoist is operated to pick parts directly from the bin, or to place parts in the bin.

U.S. Pat. No. 7,441,999 B2 issued on Oct. 28, 2008 to T. Nakao, et al. discloses an overhead travelling hoist system. An overhead buffer is provided on a side of a running rail for an overhead travelling hoist. The height level of an article on the overhead buffer is slightly lower than that on the running overhead travelling hoist. This height is at least such that the overhead buffer does not interfere with an operator. The overhead buffer can be installed even if load ports are consecutively provided.

U.S. Pat. No. 7,771,153 issued on Aug. 10, 2010 and No. U.S. Pat. No. 8,197,172 issued on Jun. 12, 2012 to B. Doherty, et al. disclose automated material handling systems (AMHS) for semiconductor manufacturing based on a combination of vertical carousels and overhead hoists. The systems allow an overhead hoist transport vehicle to load and unload Work-In-Process (WIP) parts directly to/from WIP storage units included in the system. The AMHS includes an overhead hoist transport subsystem and a vertical carousel stocker having a plurality of storage bins. The subsystem includes an overhead hoist transport vehicle traveling along a suspended track defining a predetermined route running adjacent to the stocker, allowing the vehicle to access a WIP part directly from a storage bin. At least one storage bin includes a movable shelf operative to move laterally from a first position along the carousel path to a second position near the vehicle. The storage unit is partially open to allow the movable shelf to move to the second position, allowing the hoist to access a material unit directly from the shelf for subsequent transport along the track.

U.S. Pat. No. 7,099,009 issued on Aug. 29, 2006 to J. DeGeorge, et al. discloses an automated material handling laser alignment tool for aligning a semiconductor process tool to a track system. The disclosure also relates to a method, which facilitates the calibration and alignment between a previously installed overhead transport system in a fabrication facility for semiconductor wafers and a plurality of load ports on a process tool for the semiconductor wafer or integrated circuit components, which is to be subsequently installed in the fabrication facility.

U.S. Pat. No. 8,977,387 issued on Mar. 10, 2015 to Wei-Cheng Wang, et al. discloses a system and method for overhead cross-system transportation. The system includes a conveyor-to-convey wafer carrier for transporting product to or from an overhead hoist transfer system. The system also includes a cross-system transport apparatus to transfer the wafer carrier between the conveyor and an overhead shuttle system.

SUMMARY OF THE INVENTION

The present invention generally relates to Overhead Transportation systems (hereinafter referred to merely as "a system", and in particular to such systems, which are used for transportation of Front Opening Unified Pods or Front Opening Universal Pods (FOUPs). FOUPs are special enclosures for holding silicon wafers in a controlled environment of wafer-processing shops pertaining to semiconductor manufacturing industry.

In general, the system comprises a rail-guided FOUP transportation system having stationary guide rails, which are oriented in an appropriate direction. Objects being transported, e.g., FOUPs, are placed into a crate of a special hoist with wheels, which roll along the rails. Installed on the path of the hoist is at least one or several work stations located in points of interest such as FOUP loading/unloading stations, battery replacement and charging posts, and operation performing tools such as substrate treatment equipment, etc. The hoist wheels are provided with individual in-wheel electric motors sealingly closed within the wheel casings so that the hoist drive can be used under clean-room conditions of semiconductor production. These motors are controlled by drivers powered from electric batteries installed on the hoist. In order to prevent formation of friction debris, during rolling of the wheel on the metal rail, the rolling surface of each hoist wheel is rubberized, and each wheel is provided with a soft side bumper roller to avoid accidental collision of the wheels with rails. Each hoist wheel is provided with an optical displacement sensor installed on the hoist near the respective wheel for monitoring a distance of the wheel to the vertical wall of the rail profile. Each pair of wheels, i.e., the wheels installed on the front and rear axles, is jointed with links comprising a trapezoidal, i.e., Ackermann steering mechanism. This mechanism is driven by a linear stepper motor controlled by an on-board computer in accordance with the data obtained from the aforementioned optical displacement sensors.

Furthermore, the hoist supports an optical slotted sensor installed on the chasses to register a Zero position on the rails and to read positions of an array of marks for detect positions of the work stations. By using odometry and external software commands, the Zero-position slotted sensor also makes it possible to control the speed of the hoist along the rails array of marks to detect positions of the work stations.

The system is distinguished from conventional ones of this type in that, when the hoist stops and is maintained in a stationary position, the units of the electrically driven power equipment of the hoist, other than motor wheels, such as FOUP lifting mechanism, mechanical grippers, etc., are supplied from an external source, such as a main power line provided only on the work stations.

During operation of the system, the hoists with FOUPs are moved along the overhead rails in programmed directions from station to station so that during this movement the hoist drive units are powered from self-contained batteries. When the hoist stops at a prescribed work station, the exact working position of the hoist is determined by optical sensors relative to the positioning marks so that electrical contacts of the work station are aligned with the electrical contacts of the hoist and the latter is stopped and fixed precisely in a proper working position. In this position, the FOUP either is moved down from the transportation position on the hoist and is transferred to a FOUP receiving unit or receives a new FOUP which is loaded onto it by the grippers into a position for further transportation along the rails to the next destination.

Apart from the in-wheel motors, the hoist is additionally provided with motors or servo-motors intended for raising, turning the wheels and reorienting them to other rails. All drivers and movements of the hoists with FOUPs are controlled from a computer so that the system provides preprogrammed fully automatic operation of the hoists. By means of the computer, the movements of the hoist are coordinated with such operations as replacement and charging of batteries, lifting/descending the FOUPs by means of automatic grippers, and orienting the hoist wheels for movement on rails in the multiple-branched trajectories of movement, etc.

DETAILED DESCRIPTION OF THE INVENTION

The present invention relates generally to Overhead Transportation systems, and, in particular, to such systems, which are intended for transportation of Front Opening Unified Pods or Front Opening Universal Pods (FOUPs) in the clean-room environment of semiconductor processing and manufacturing shops.

Figure 1A:
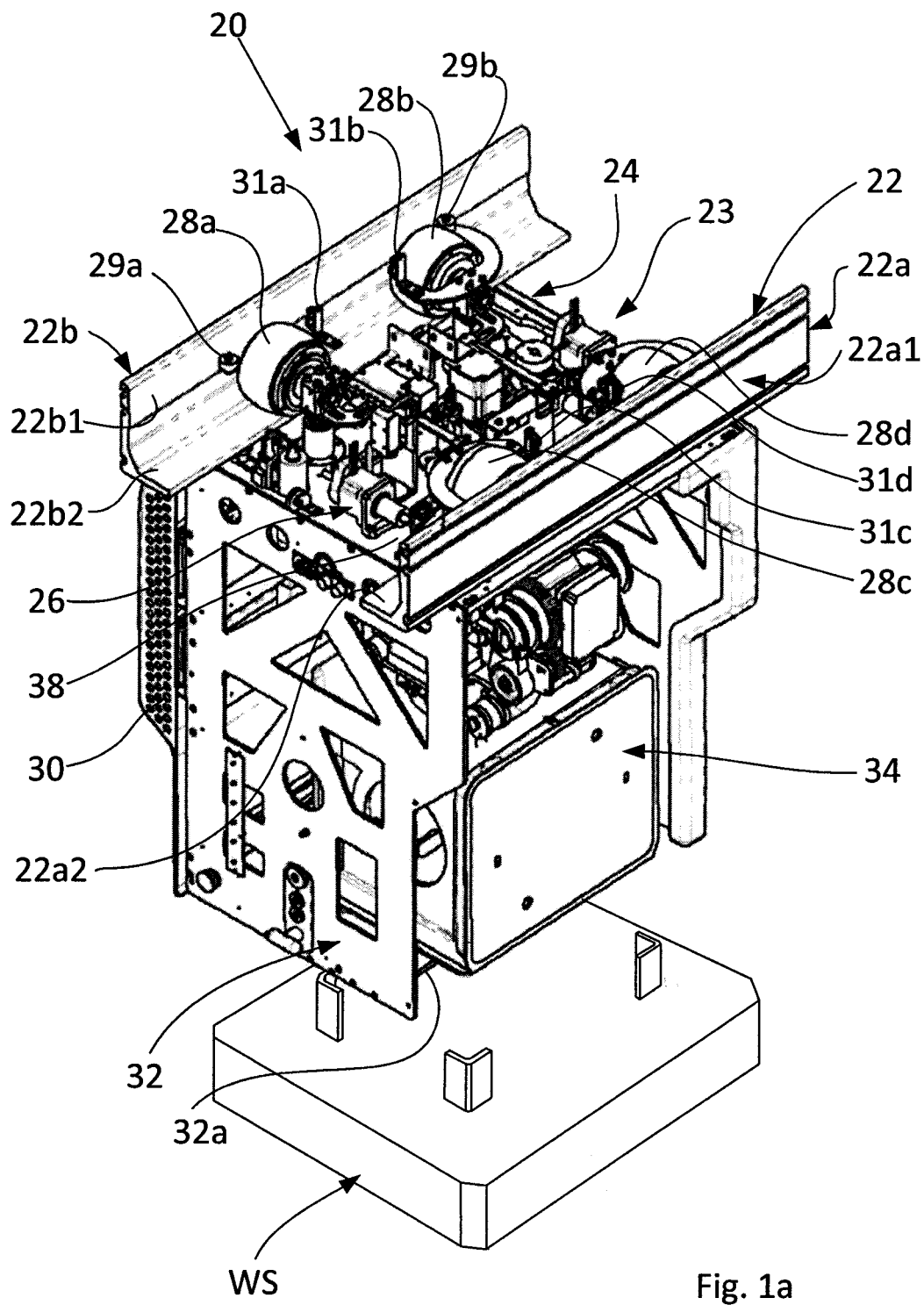
FIG. 1A is a three-dimensional view illustrating the gripper mechanism with grippers and a gripper-mechanism supporting device.

A general three-dimensional view of an overhead transportation system of the invention for transportation of FOUPs under "clean room" conditions at the semiconductors manufacturing plant is shown in FIG. 1A. In this drawing, the FOUP transportation system, which in general is designated by reference numeral 20, contains a stationary overhead rail structure 22 attached to the ceiling of the shop (not shown) or otherwise fixed in a stationary position. The overhead rail structure 22 is shown as a pair of parallel horizontal rails 22a and 22b having a predetermined direction along a transportation route and separated by a space 23.

As can be seen from FIG. 1A, each rail has an angular profile defined by a vertical side wall (22a1, 22b1) and a horizontal tracking flange (22a2, 22b2).

The FOUP transportation system 20 is provided with at least one work station WS located in the point of interest along the rails 22a and 22b. The work station WS is intended for performing such operations as FOUP loading/unloading, battery replacement and charging, etc. The work station WS is located in a lateral position with respect to the parallel horizontal rails 22a and 22b beyond the boundaries of the rails and at a level below the parallel horizontal rails, e.g., on the shop floor.

Figure 2:
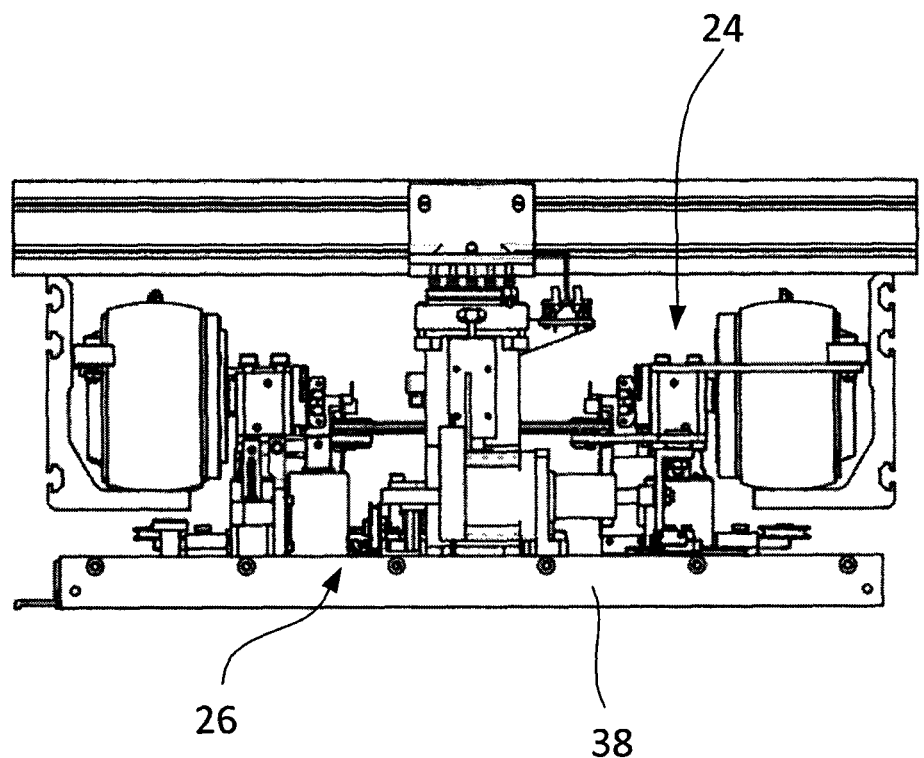
FIG. 2 is an end view of the chassis and two pairs of independently controlled wheels, which roll over the horizontal tracking flange of the rails in the system of FIG. 1A.

The rails 22a and 22b serve for guiding a hoist 24 having a chassis 26, better shown in FIG. 2, which is an end view on the chassis, and two pairs of independently controlled wheels 28a, 28b and 28c, 28d (FIG. 1A) which roll over the horizontal tracking flange (22a2, 22b2) of the rails 22a and 22b, respectively. The hoist 24 hangs downward from the horizontal rails through the aforementioned space 23 and rolls along the rails at a level above the work station WS.

Each wheel 28a, 28b and 28c, 28d has an in-wheel drive motor hermetically sealed inside the wheel housing. The wheel drive motors and a control unit for controlling a torque transmitted to each wheel drive motor. The in-wheel motors receive an electric power from at least one replaceable and/or rechargeable electric battery 30 attached to the housing of the hoist 24.

In order to prevent formation of friction debris during rolling of the wheel 28a, 28b and 28c, 28d on the metal rails 22a and 22b, the outer surface of each hoist wheel is rubberized, and each hoist wheel is provided with an optical displacement sensor, such as sensors 31a, 31b, 31c, 31d installed on the hoist near the respective wheels 28a, 28b, 28*c*, 28*d*, respectively, for monitoring a distance of the wheel to the vertical wall of the rail profile. Each pair of the wheels, i.e., the wheels 28*b*, 28*d* and 28*a*, 28*c* (FIG. 1A), installed on the front and rear axles, respectively, is jointed with links 33*a* and 33*b* comprising a trapezoidal, i.e., Ackermann steering mechanism, such as a mechanisms 35*a* and 35*b* shown in FIG. 1B, which is a top view of the chasses 26. These mechanisms are driven by linear stepper motors 37*a* and 37*b* controlled by an on-board computer (not shown) in accordance with the data obtained from the aforementioned optical displacement sensors 31*a*, 31*b*, 31*c*, and 31*d* (FIG. 1A).

Furthermore, the hoist supports an optical slotted sensor installed on the chasses to register a Zero position on the rails and to read positions of an array of marks for detecting positions of the work stations. By using odometry and external software commands, the Zero-position slotted sensor also makes it possible to control the speed of the hoist along the rails and to detect positions of the work stations by using an array of marks.

Furthermore, each wheel is provided with a soft side bumper roller, such as bumper rollers (only two of these four rollers, i.e., rollers 29*a* and 29*b* are seen in FIG. 1A), which are spacedlrom the vertical side walls 22*a*1 and 22*b*1 of the rail profiles and ensure a space between the hoist wheels 28*a*, 28*b* and 28*c*, 28*d* and the vertical side walls.

The lower part of the hoist housing forms a crate 32 with a space 32*a* for retaining an object being transported, in this case, a FOUP 34. In this specification, the FOUP 34 is shown as a transport object only as an example, and it is understood that any other objects, including those intended for handling in the clean-room production environment, may be suitable for the purposes of the present invention.

Figure 3:
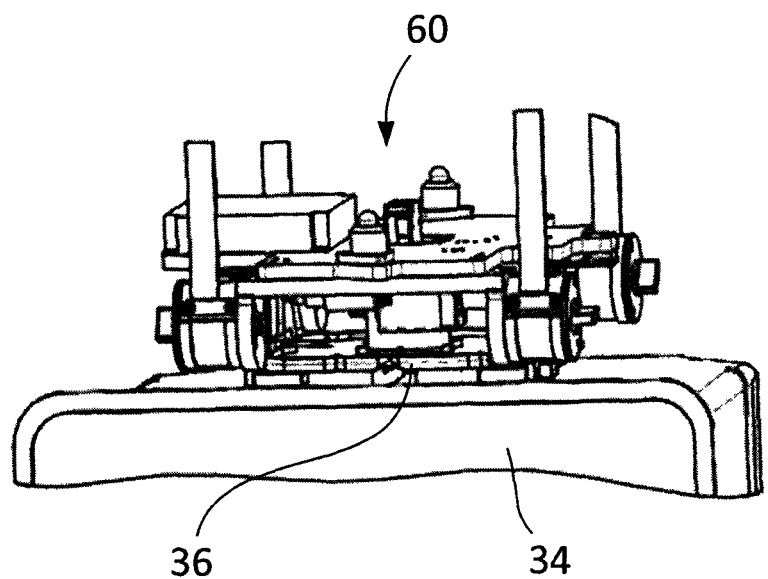
FIG. 3 is a view of a part of the FOUP with the grippers in the slits of the top robotic flange of the FOUP transported by the system of the invention.

The FOUP 34 shown herein is the Spectra™ FOUP for clean and secure wafer transport (the product of INTEGRIS Co., MA, USA). The FOUP 34 has the following dimensions: 416 mm width, 333 mm depth, and 335 mm height. The weight is 7.3 kg, waver spacing: 10 mm; capacity: 25 wafers. It has a top robotic flange 36 (see FIG. 3, which is a view of the gripper mechanism 60 on the FOUP 34) with gripper-receiving slits 34*a*, 34*b* for grippers 64*a* and 64*b* of the gripper mechanism, which are shown and described later with reference to FIG. 10. However the hoist is capable to lift and carry any standard FOUP including FOUPs with inserts for 200 and 150 mm wafers of combine weight up to 15 kg, and the similar hoists can carry SMIF canisters and other types of cassettes, i.e. frame cassettes.

Figure 4:
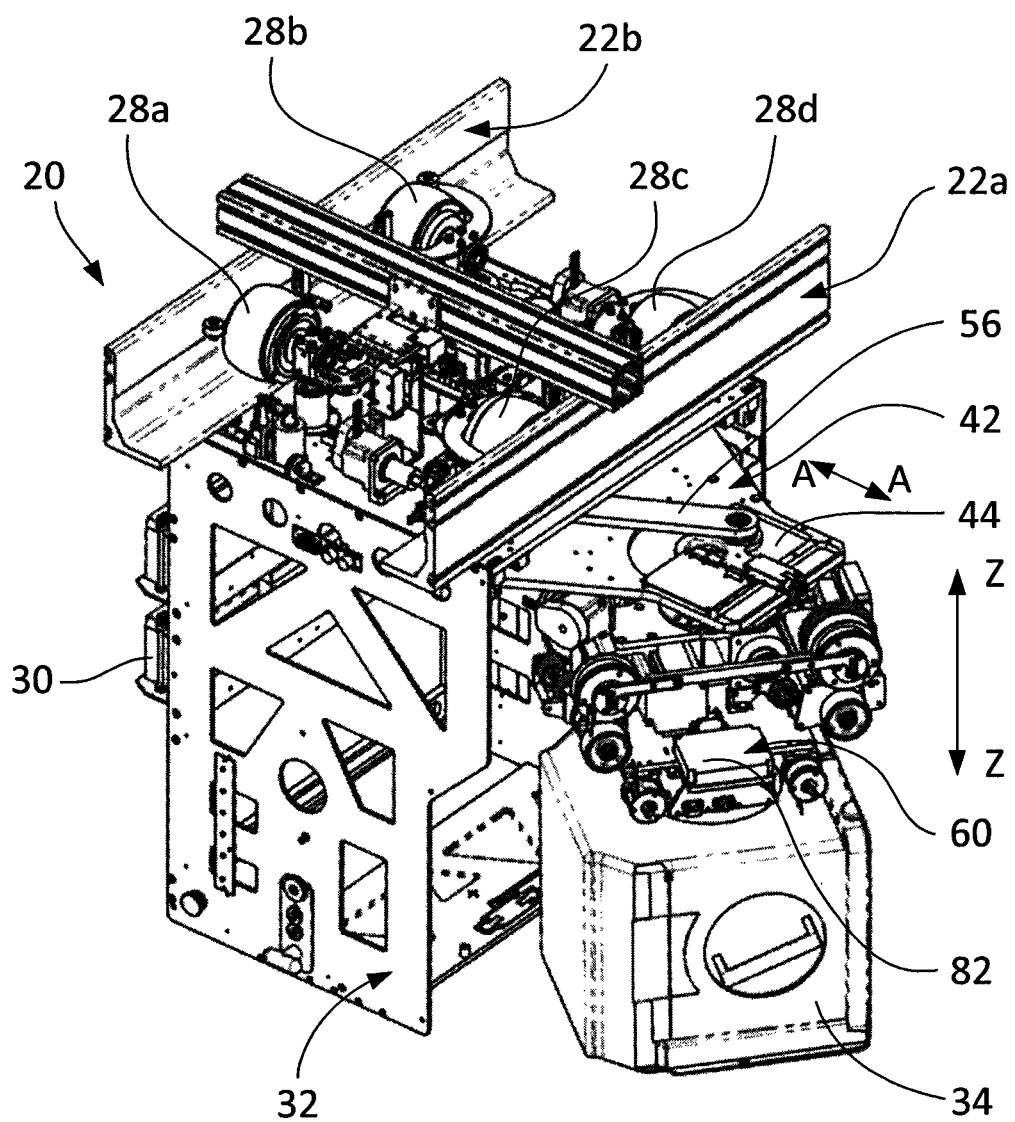
FIG. 4 is a three-dimensional view of the transportation system of the invention showing the FOUP in a position extended from the crate and turned at a certain angle relative to the position of the FOUP in the crate.
Figure 5:
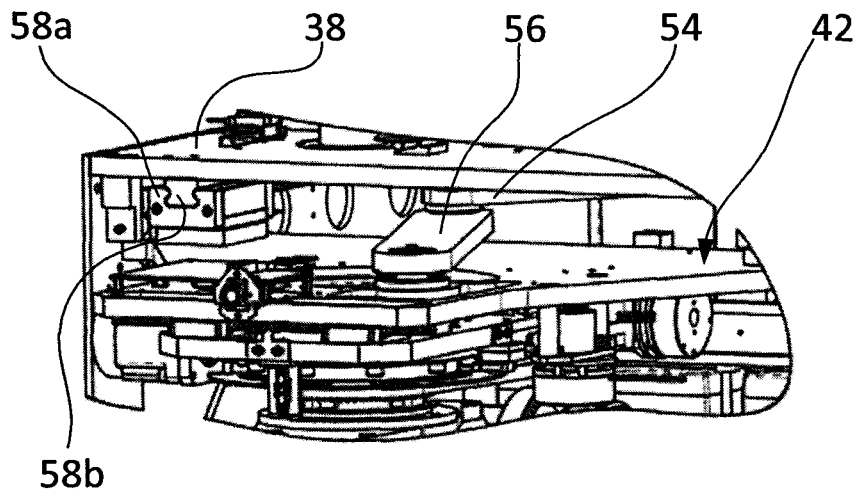
FIG. 5 is a three-dimensional rear view of a part of a slider plate mechanism in the system of the invention.
Figure 6:
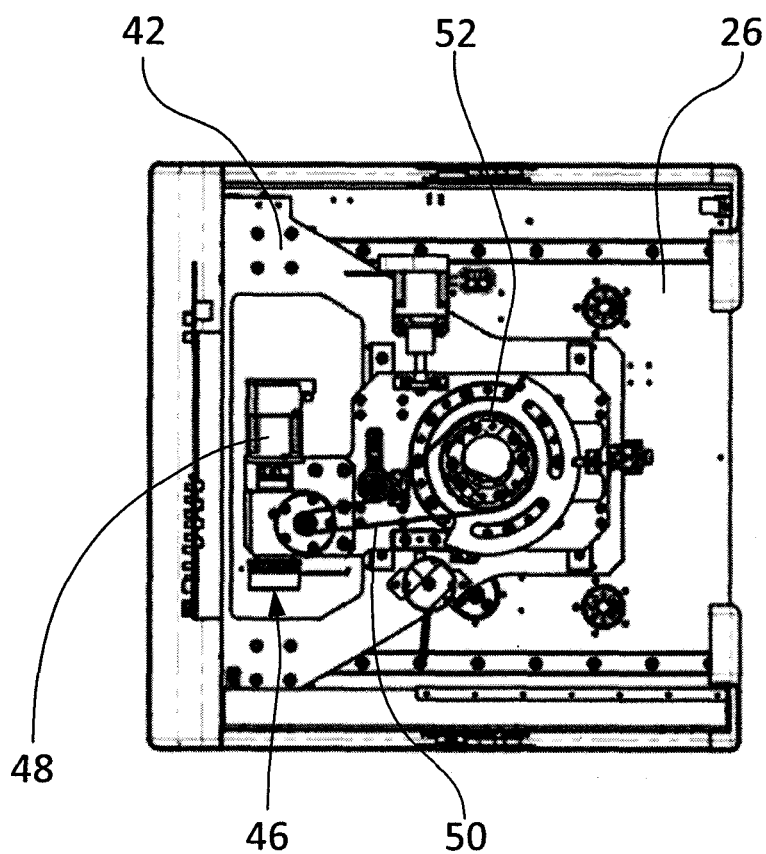
FIG. 6 is a view of a drive unit of the slider plate of FIG. 5.

The chasses 26 supports a slider plate 42 shown in FIGS. 4, 5, and 6, wherein FIG. 4 is a three-dimensional view of the transportation system of the invention showing the FOUP 34 in a position extended from the crate 40 and turned at a certain angle relative to the position of the FOUP in the crate. FIG. 5 is a three-dimensional rear view on a part of a slider plate mechanism, and FIG. 6 is a view of a drive unit of the slider plate 42. The sliding plate 42 is linearly moveable in the direction of the arrow A (FIG. 4) and rotationally supports a swinging member 44 that can be turned around a vertical axis Z-Z (FIG. 4).

Figure 7:
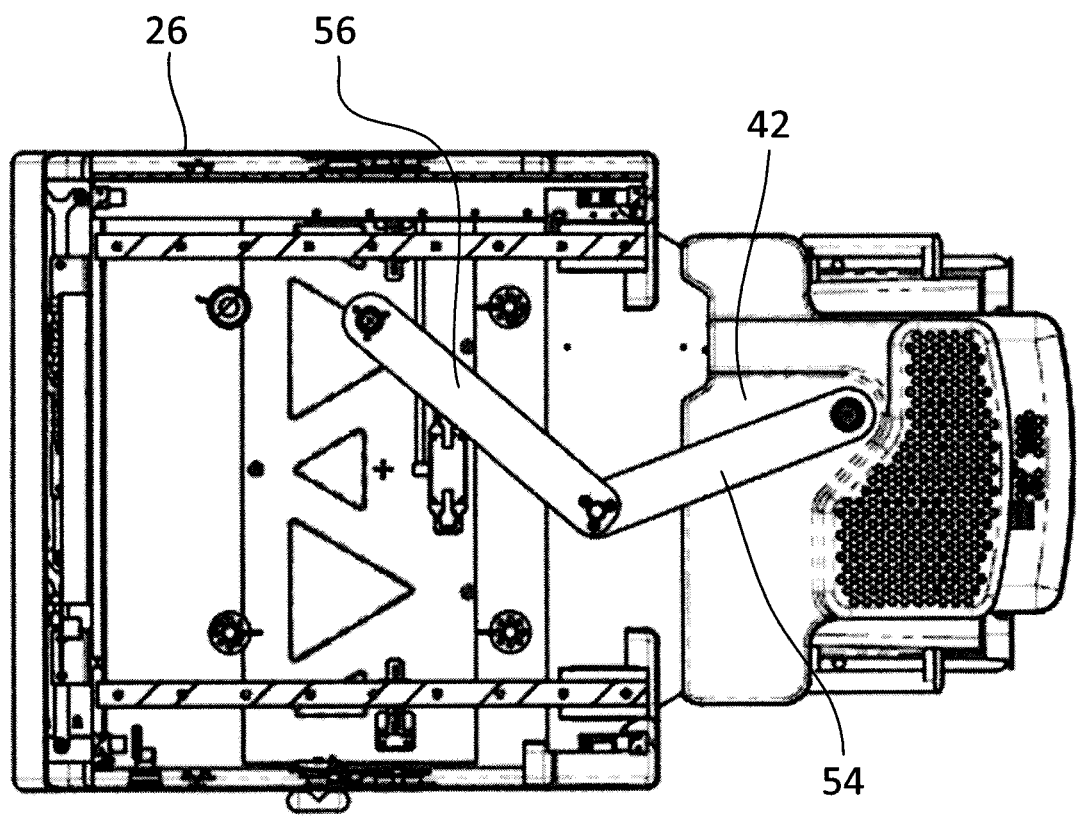
FIGS. 7 and 8 show different positions of the crank and the connecting rod with extension and withdrawal of the slider plate from and into the chasses.
Figure 8:
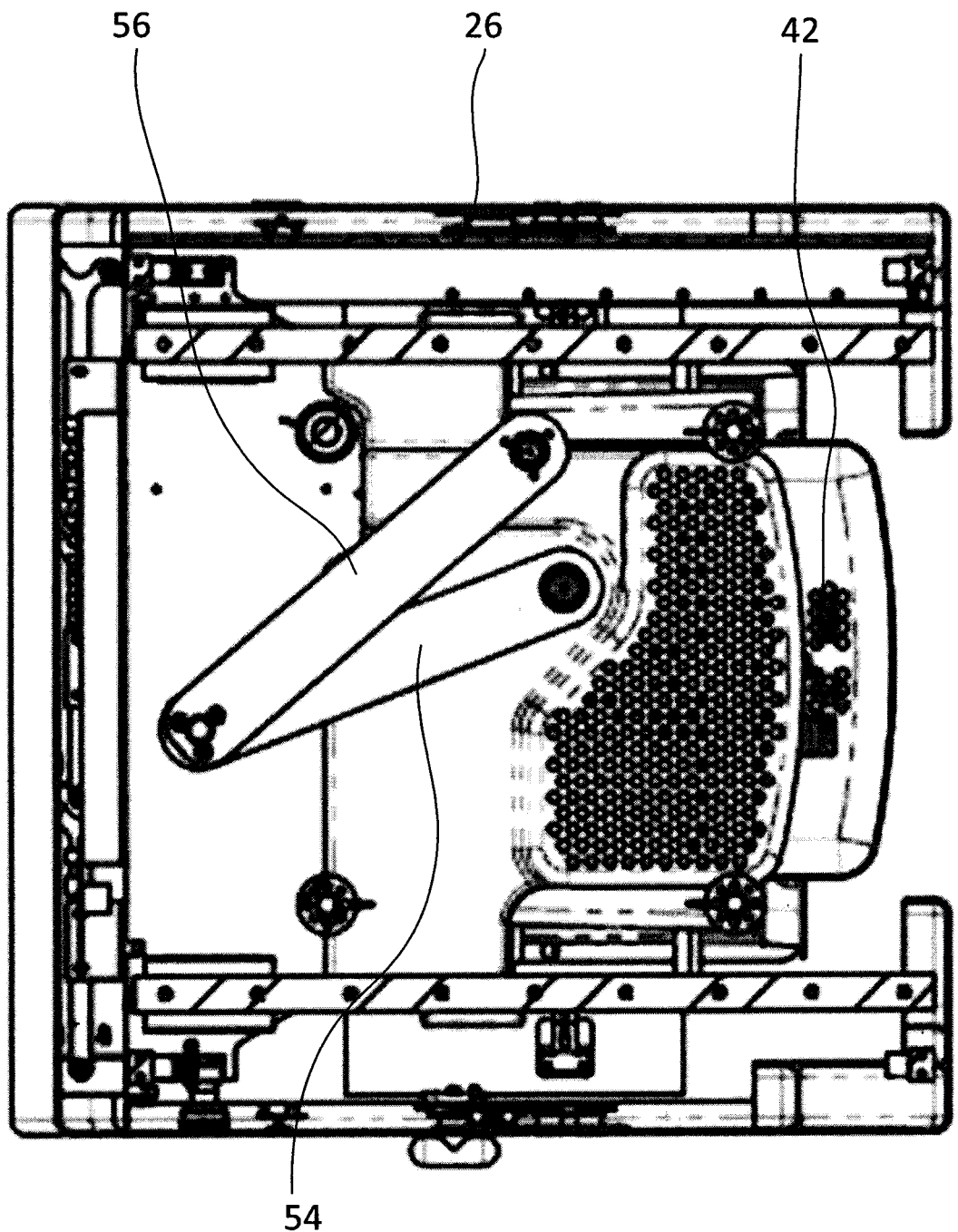

A slider plate drive mechanism 46 consists of a slider plate drive motor 48, which transmits rotation via a tooth belt 50 to a gear wheel 52, a crank 54 secured to the gearwheel 52, and a connecting rod 56 (FIGS. 4 and 5) pivotally connected to the slider plate 42. The slider plate 42 supports a profiled linear guide element 58*a*, which in FIG. 5 is shown as an element with a profiled linear groove, which is guided along a mating profiled linear guide rod 58*b* secured to the bottom plate 38 of the chasses 26. Thus, the crank 54, the connecting rod 56, and the slider plate 42 form a crank mechanism. This crank mechanism is used for linearly moving the slider plate 42 in the lateral direction away from the rails 28*a* and 28*b* (direction shown by arrow A in FIG. 4), e.g., toward the work station WS (FIG. 1A) or for withdrawing the slider plate 42 into the chassis. Different positions of the crank 54 and the connecting rod 56 with extension and withdrawal of the slider plate 42 from and into the chasses 26 are shown in FIGS. 7 and 8, respectively.

As has been mentioned above, the sliding plate 42 rotationally supports the swinging member 44 that can be turned around a vertical axis Z-Z (FIG. 4). FIG. 1A is a three-dimensional view illustrating the gripper mechanism 60 with grippers 64*a* and 64*b* and a gripper mechanism supporting mechanism 66, which is attached to the swinging member 44 and supports the gripper mechanism 60 in a state hanging down from the swinging member 44 by means of three-functional straps 68*a*, 68*b*, 68*c*, and 68*d*.

These straps accomplish the following functions: ascending/descending the gripper mechanism 60; transmitting the power and signals to the grippers and associated control units; and measuring the tension in the strap like a strain gage and thus controlling the load applied to the gripper mechanism lifting/descending drive units.

Figure 9:
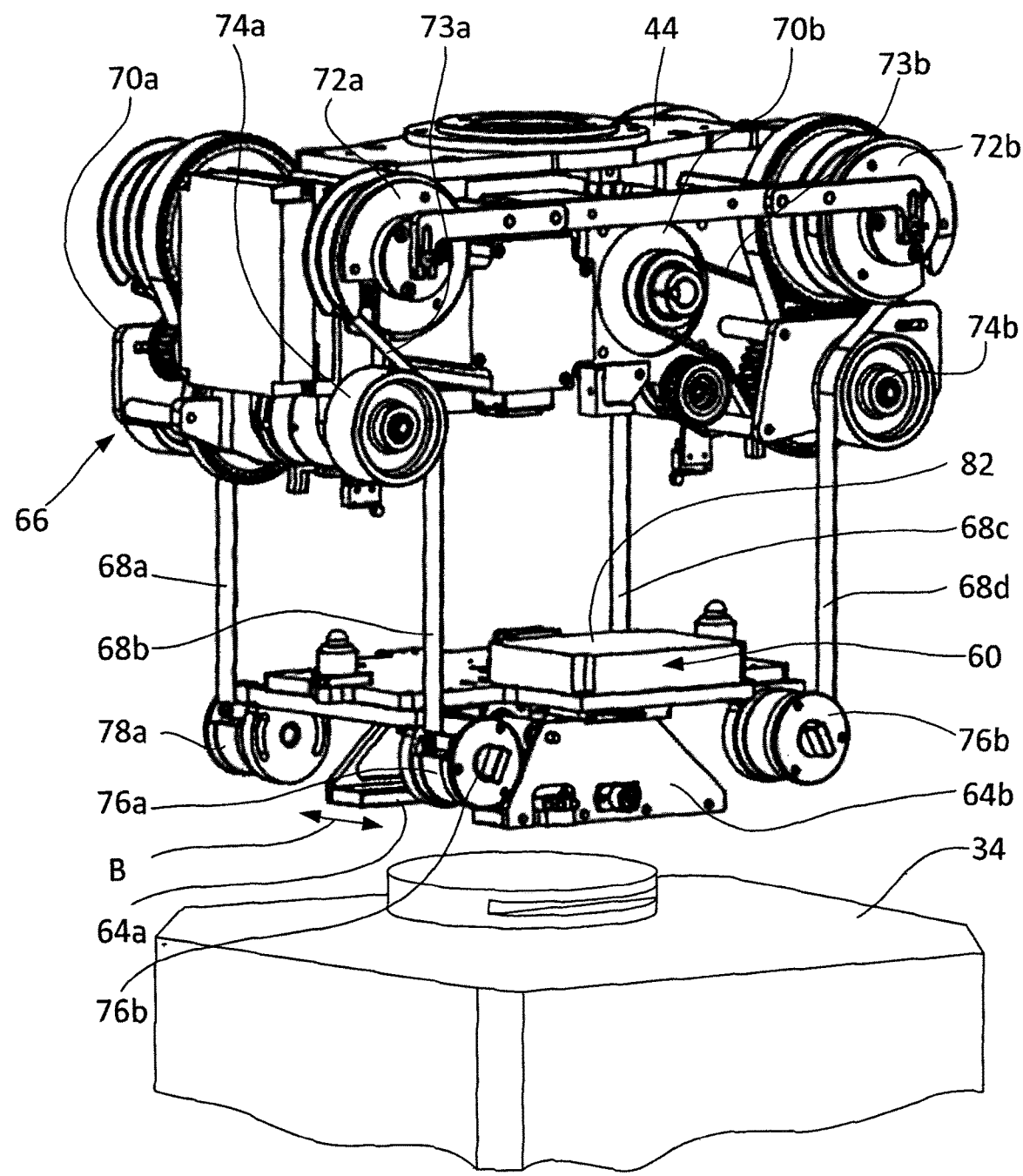
FIG. 9 is a three-dimensional view illustrating the gripper mechanism with grippers and a gripper-mechanism supporting device.

The drive units for raising the gripper mechanism on the straps are motors 70*a* and 70*b* which transmit the rotary power through transmission belts 73*a*, 73*b*, etc. to a system of pulleys 72*a*, 72*b*, 72*c*, 74*a*, 74*b*, 74*c*, . . . 76*a*, 76*b*, 78*a*, etc. The multifunctional straps 68*a*, 68*b*, 68*c*, and 68*d* are guided through these pulleys, of which the four lower pulleys (only three lower pulleys 76*a*, 76*b*, and 78*a* are seen in FIG. 1A) are attached to the gripper mechanism 60. In other words, the gripper descending and raising mechanism contains rotary motors (only two of the motors, i.e., the motor 70*a* and 70*b* are seen in FIG. 1A) and a system of transmission belts 73*a*, 73*b*, 75*a*, 75*b* with pulleys 72*a*, 72*b*, 72*c*, 74*a*, 74*b*, 74*c*, which are upper drive pulleys having axles secured in the chasses 26, and lower driven pulleys 76*a*, 76*b*, 76*c* (one more pulley is not seen), which hang on the electrically conductive straps 68*a*, 68*b*, 68*c*, and 68*d* and have their axles secured in the gripper mechanism 60. FIG. 9 is a three-dimensional view illustrating the gripper mechanism 60 with grippers and a gripper-mechanism supporting device. When motors 70*a* and 72*b* are energized, the straps are wound on the upper pulleys thus pulling the lower pulleys up together with the gripper mechanism 60 or letting the gripper mechanism to go down under its own weight.

Figure 10:
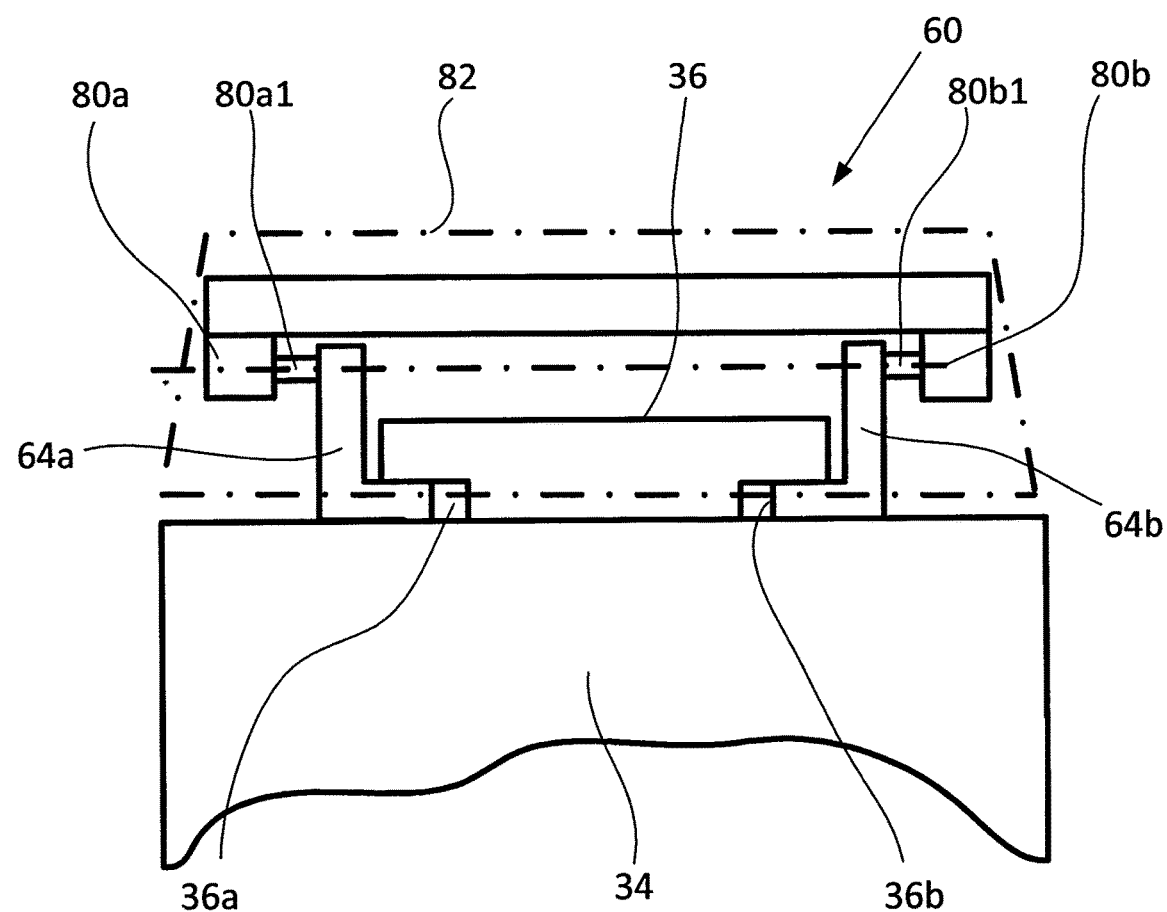
FIG. 10 is a schematic view illustrating the gripper drive and interaction of the grippers with the slits of the top robotic flange of the FOUP.

The grippers 64*a*, 64*b* and their interaction with the slits 36*a* and 36*b* of the top robotic flange 36 of the FOUP are shown in FIG. 10. The grippers 64*a* and 64*b* are attached to the output shafts 80*a*1 and 80*b*1 of two linear stepper motors 80*a* and 80*b*. The motors are reversible. When the motors are energized, their shafts move in the opposite directions. Grabbing and gripping of the FOUP is performed by moving the grippers to each other for inserting them into slits 36*a* and 36*b*. Release of the FOUP from the gripper mechanism 60 is performed by reversing the motors 80*a* and 80*b* and withdrawing the grippers 64*a* and 64*b* from the respective slits.

The electrically conductive multifunctional straps 68*a*, 68*b*, 68*c*, and 68*d* may be made from customized band R-series sensors produced by EMFIT, Ltd., Finland. The straps incorporate the function of electrical conductivity, measuring tension in the strap and controlling the load being raised. This band-type sensor consists of a sensing element constructed of Emfit ferroelectret film and three layers of electrodes on polyester films, either aluminum or copper electrodes. Crimped connectors are used for connecting to electrodes. Copper electrodes make it possible also, solder wires directly onto them.

Figure 11:
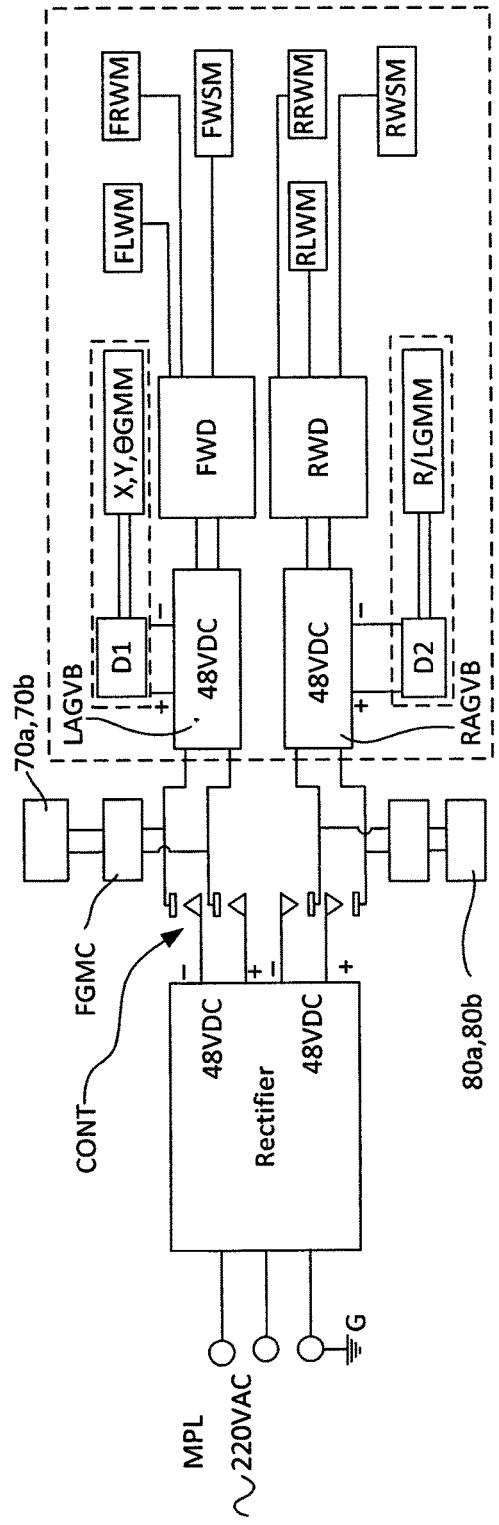
FIGS. 11 and 12 are electric block diagrams illustrating operation of electric drives during movement of the hoist along the rails and at the stage of charging of left-side and right-side batteries.
Figure 12:
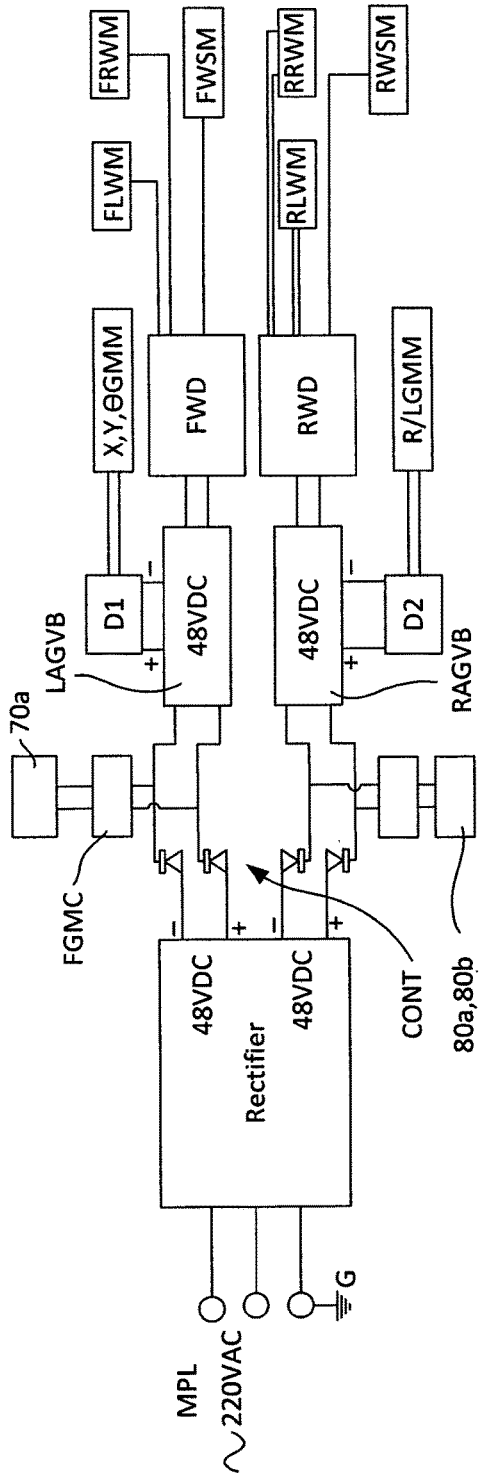

FIGS. 11 and 12 are electric block diagrams illustrating operation of electric drives during movement of the hoist 24 along the rails 22a and 22b and at the stage of charging of left-side and right-side batteries LAGVB and RAGVB, respectively, where AGVB stands for Automated Guided Vehicle Battery. As mentioned above, when the hoist 24 stops and is maintained in a stationary position, the units of the electrically driven power equipment of the hoist, other than in-wheel motors, FOUP lifting mechanism, mechanical grippers, etc., are supplied from an external source, such as a main power line MPL provided only on the work stations WS. At the stationary state, the batteries are charged from the MPL and the in-wheel motors are disconnected from the batteries. On the other hand, when the hoist 24 moves, the in-wheel motors FLWM, FRWM, RLWM, and RRWM are connected to the newly charged batteries and which autonomously feed the in-wheel motors. These two conditions are shown in FIGS. 11 and 12. In FIG. 11 the contacts CONT are opened, while in FIG. 12, the contacts CONT are closed.

Figure 1B:
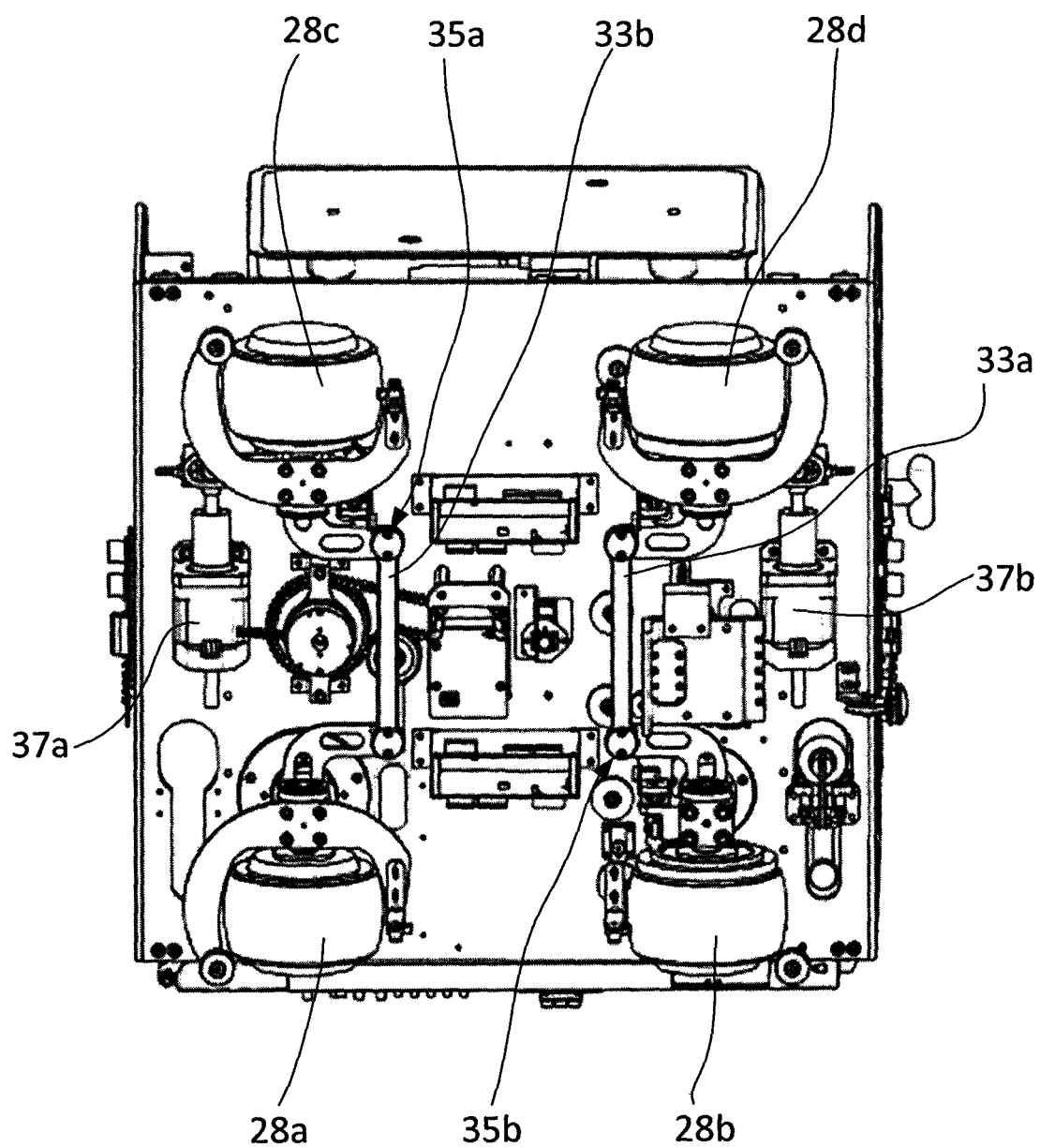
FIG. 1B is a top view of the chasses.

FWSM stands for front wheel stepper motor 37a, and RWSM stands for rear wheel stepper motor (Ackermann steering mechanisms 35a and 35b, FIG. 1B).

The aforementioned servo-motors and other motors and their drivers are controlled from a computer so that the system provides pre-programmed fully automatic operation of the hoists. By means of the computer, the movement of the hoist are coordinated with such operations as replacement and charging of batteries, lifting/descending the FOUPs by means of automatic grippers, orientation of the hoist wheels for movement on rails in the multiple-branched trajectories of movement, etc.

Although the invention has been described in details with reference to specific drawings illustrating various parts and units of the overhead transportation system, it is understood that these details and drawings are given only as examples and that, any changes and modifications are possible without deviation from the scopes of the attached patent claims. For Example, the objects to be transported are not necessarily FOUPs. The carriage and arrangement of its parts may be different from those shown in the drawings. Drives and power transmission elements may be different from stepper motors and pulley-belt transmissions. More than one work station may be included into the system. The sensors are not necessarily optical and may be inductive, or the like. Although one or two batteries are shown in FIGS. 1A and 4, the number of batteries may exceed two.

The invention claimed is:

1. An overhead transportation system for transporting objects between multiple work stations comprising:
    a stationary overhead rail structure having a transportation route and at least one work station located in a lateral position with respect to the stationary overhead rail structure and at a level below the stationary overhead rail structure;
    a hoist guided along the rail structure at a level above the work station, the hoist comprising:
        a) a chassis with two pairs of independently controlled wheels which roll over the stationary overhead rail structure, each wheel having an in-wheel drive motor hermetically sealed therein;
        b) a crate for retaining an object being transported;
        c) a slider plate mechanism having a slider linearly moveable in the lateral direction from the chasses toward the work station or withdrawal into the chassis;
        d) a slider plate drive mechanism for linearly moving the slider comprising a slider plate drive motor, a crank rotatable by the drive motor, a connecting rod having one end pivotally connected to the crank and another end pivotally connected to the slider, a first profiled linear guide element attached to the carriage, and a second profiled linear guide element guided along the first profiled guide element and attached to the slider;
        e) a swinging member rotationally supported by the slider with a swinging member drive unit for turning the swinging member around a vertical axis;
        f) a gripper mechanism with grippers for grasping, gripping and releasing the object, the gripper mechanism comprising a gripper mechanism drive unit for activating the grippers of the gripper mechanism for grasping and releasing the object, a gripper mechanism descending and raising unit for lowering and lifting the grippers with or without the object, a drive unit for the driving gripper mechanism descending and raising unit, the gripper mechanism descending and raising unit having one end attached to the swinging member and another end connected to the gripper mechanism, the gripper mechanism descending and raising unit incorporating a force tensometric function for controlling a weight of the object hanging on said other end;
    at least one electrical battery installed on the hoist for supplying power at least to said each in-wheel drive motor;
    a group of first contacts located on the hoist and electrically connected at least with the slider plate drive mechanism, the swinging member drive unit, the drive unit for driving the gripper mechanism descending and raising unit, and the gripper mechanism drive unit;
    an external power source located beyond the hoist; and
    a group of second contacts which are located in a position beyond the hoist and are electrically connected to the external power source, the contacts of the first group and the second group being electrically connected when the hoist stops for loading/unloading the object into and from the work station.

2. The overhead transportation system according to claim 1, wherein the gripper mechanism descending and raising unit comprises electrically conductive straps that incorporate functions of electrical conductivity, measuring tension in the strap, and controlling the load being raised.

3. The overhead transportation system according to claim 2, wherein the stationary overhead rail structure comprises a pair of parallel horizontal rails having a predetermined direction along the transportation route and separated by a space, each rail having an angular profile defined by a vertical side wall and a horizontal tracking flange.

4. The overhead transportation system according to claim 3, wherein the independently controlled wheels are rubberized and wherein each of the independently controlled wheels is provided with a side bumper roller, which is installed in a vicinity of the wheel and maintains a space between the wheels and the vertical side walls.

5. The overhead transportation system according to claim 4, wherein the gripper mechanism drive unit for activating the grippers of the gripper mechanism comprises a pair of linear stepper motors which are reversible and, when energized, move grippers in opposite directions toward each other or vice versa.

6. The overhead transportation system according to claim 3, wherein the gripper descending and raising mechanism further comprises: rotary motors and a system of transmission belts and pulleys which include upper drive pulleys having axles secured in the chassis and lower driven pulleys which hang on the electrically conductive straps and have axles secured in the gripper mechanism.

7. The overhead transportation system according to claim 3, wherein the hoist is further provided with optical displacement sensors installed in a vicinity of the independently controlled wheels to detect position of the work stations and to control a speed of hoist.

8. The overhead transportation system according to claim 3, wherein said at least one work station is located along said transportation route and the chassis of the hoist is located in said space between the pair of the parallel horizontal rails.

9. The overhead transportation system according to claim 8, wherein the gripper descending and raising mechanism further comprises: rotary motors and a system of transmission belts and pulleys which include upper drive pulleys having axles secured in the chassis and lower driven pulleys which hang on the electrically conductive straps and have axles secured in the gripper mechanism.

10. The overhead transportation system according to claim 9, wherein the hoist is further provided with optical displacement sensors installed in a vicinity of the independently controlled wheels to detect a position of the work station and to control a speed of hoist.

11. The overhead transportation system according to claim 3, wherein the gripper mechanism drive unit for activating the grippers of the gripper mechanism comprises a pair of linear stepper motors which are reversible and, when energized, move grippers in opposite directions toward each other or vice versa.

12. The overhead transportation system according to claim 2, wherein the gripper descending and raising mechanism further comprises: rotary motors and a system of transmission belts and pulleys which include upper drive pulleys having axles secured in the chassis and lower driven pulleys which hang on the electrically conductive straps and have axles secured in the gripper mechanism.

13. The overhead transportation system according to claim 12, wherein the hoist is further provided with optical displacement sensors installed in a vicinity of the independently controlled wheels to detect a position of the work station and to control a speed of hoist.

14. The overhead transportation system according to claim 12, wherein the gripper mechanism drive unit for activating the grippers of the gripper mechanism comprises a pair of linear stepper motors which are reversible and, when energized, move grippers in opposite directions toward each other or vice versa.

15. The overhead transportation system according to claim 12, wherein each pair of the two pairs of the independently controlled wheels constitutes a front wheel and a rear wheel, and wherein the front wheel and the rear wheel of each pair are linked through an Ackermann steering mechanism, the system being further provided with a stepper motor for controlling operation of each Ackermann steering mechanism.

16. The overhead transportation system according to claim 2, wherein the hoist is further provided with optical displacement sensors installed in a vicinity of the independently controlled wheels to detect a position of the work station and to control a speed of hoist.

17. The overhead transportation system according to claim 1, wherein the hoist is further provided with optical displacement sensors installed in a vicinity of a independently controlled wheels to detect a position of the work station and to control a speed of hoist.

18. The overhead transportation system according to claim 1, wherein the gripper mechanism drive unit for activating the grippers of the gripper mechanism comprises a pair of linear stepper motors which are reversible and, when energized, move grippers in opposite directions toward each other or vice versa.

19. The overhead transportation system according to claim 1, wherein each pair of the two pairs of the independently controlled wheels constitutes a front wheel and a rear wheel, and wherein the front wheel and the rear wheel of each pair are linked through an Ackermann steering mechanism.

20. The overhead transportation system according to claim 19, further comprising a stepper motor for controlling operation of each Ackermann steering mechanism.

* * * * *